(12) United States Patent
Kolinummi et al.

(10) Patent No.: US 7,843,220 B2
(45) Date of Patent: Nov. 30, 2010

(54) INTEGRATED CIRCUITS

(75) Inventors: Pasi Kolinummi, Kangasala (FI); Klaus Melakari, Oulu (FI); Marko Winblad, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 12/519,725

(22) PCT Filed: Dec. 22, 2006

(86) PCT No.: PCT/IB2006/055022

§ 371 (c)(1),
(2), (4) Date: Nov. 13, 2009

(87) PCT Pub. No.: WO2008/078152

PCT Pub. Date: Jul. 3, 2008

(65) Prior Publication Data

US 2010/0097100 A1    Apr. 22, 2010

(51) Int. Cl.
*H03K 19/0175* (2006.01)

(52) U.S. Cl. .............................. 326/62; 326/56; 326/80; 326/83

(58) Field of Classification Search ........................ None
See application file for complete search history.

(56) References Cited

U.S. PATENT DOCUMENTS

| | | | | |
|---|---|---|---|---|
| 5,479,618 A | | 12/1995 | Van de Steeg et al. | |
| 5,555,438 A | * | 9/1996 | Blech et al. | 710/30 |
| 5,561,384 A | * | 10/1996 | Reents et al. | 327/108 |
| 5,914,627 A | | 6/1999 | Fotouhi | |
| 2005/0184758 A1 | | 8/2005 | Hoberman et al. | 326/83 |
| 2006/0214687 A1 | | 9/2006 | Arora et al. | |
| 2008/0279288 A1 | * | 11/2008 | Crawley et al. | 375/244 |

OTHER PUBLICATIONS

"International Search Report and The Written Opinion of the International Searching Authority", received in corresponding PCT Application No. PCT/IB2006/055022, Dated Sep. 21, 2007, 10 pages.

* cited by examiner

*Primary Examiner*—Anh Q Tran
(74) *Attorney, Agent, or Firm*—Harrington & Smith

(57) ABSTRACT

An integrated circuit comprises a processor, a controller and plural terminals. Each terminal constitutes a connection between the integrated circuit and a peripheral device. Each terminal is connected to a logic circuit on the integrated circuit by a respective IO cell in series connection with a respective IO isolation circuit and wherein the controller is operable on power up of the integrated circuit to activate a reset state and to release the reset state prior to releasing IO isolation by one or more of the IO isolation circuits. Each IO isolation circuit may be arranged so that a default state of the IO isolation circuit is a state in which the IO cell is isolated from the logic circuit. The IO isolation circuits may be controllable by software, for instance a driver for a peripheral device connected to the terminal associated with the IO isolation circuit. Plural IO isolation circuits may be connected so as to be commonly controllable by a single control signal from the controller.

20 Claims, 4 Drawing Sheets

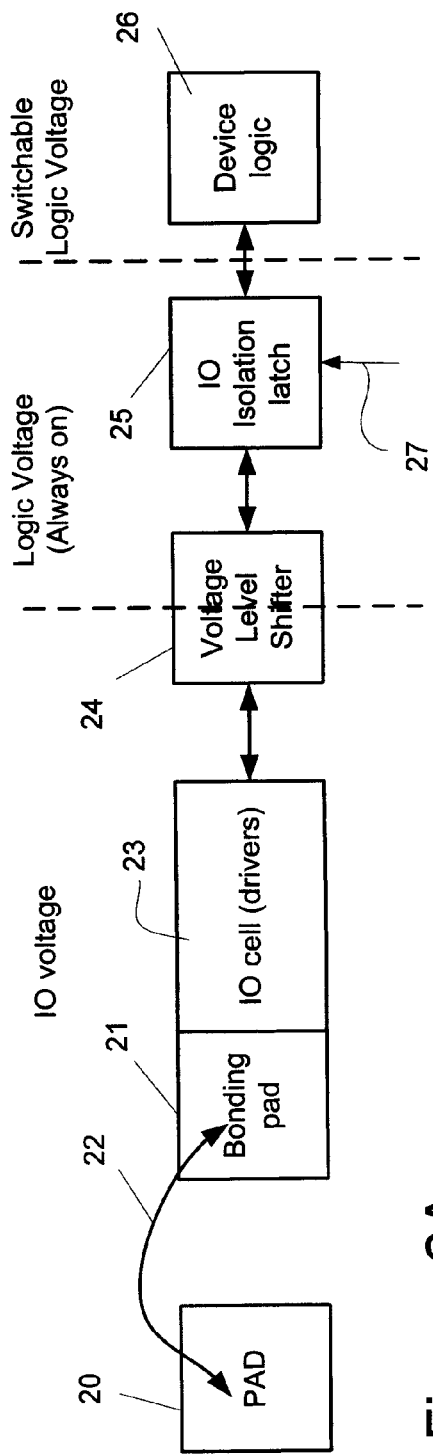
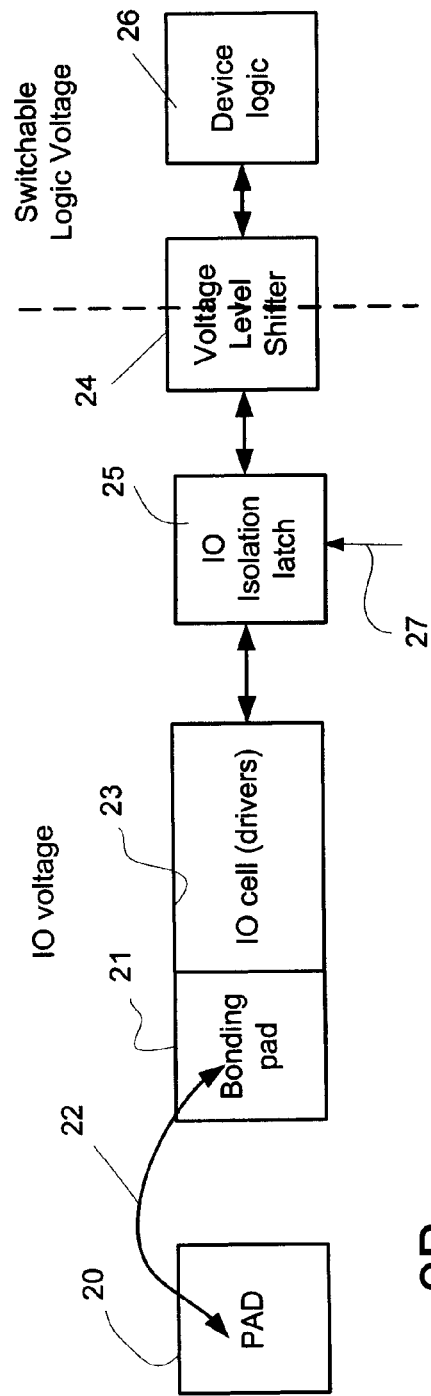
Figure 2A
Figure 2B

INTEGRATED CIRCUITS

RELATED APPLICATION

This application was originally filed as PCT Application No. PCT/IB2006/055022 filed Dec. 22, 2006.

This invention relates to an integrated circuit, to a method of operating an integrated circuit, and to machine readable instructions which when executed by computing apparatus control it to perform a method of operating an integrated circuit.

Integrated circuits (ICs) now commonly include plural logic circuits within a single package. Especially when used in mobile applications, for instance mobile telephones, PDAs and the like, it can be important to employ power saving measures. Such ICs tend to include a processor, one or more other substantial logic circuits and an 'always active' area. The always active area includes a controller, and is particularly important in power up from and power down to sleep mode situations.

To allow connection of the logic circuits on the IC to peripheral devices, including SDRAM, ROM, keypads, display drivers, etc., a number of pads are provided on the IC, and each pad is connected to a pin forming part of a package encapsulating the IC. A pad typically is connected to a pin by a wire bond, although there are other connection options. Associated with each pad is an input/output (IO) cell. IO cells are drivers, and can be quite advanced circuits, allowing multiplexed connection to various points on the logic circuits on the IC, and being configurable to provide input or output connection, accommodate different voltage levels, different driver strengths, tree state control, etc as required. These features allow a particular IC design to be useable in many different and varied applications with only different programming code being required for each application.

The first time that the IC is powered up, the IO cells are set to default (reset) values and then are configured by hardware. During configuration, the IO cells are assigned to be input or output cells. Where an IO cell is configured to be an output cell, configuration involves setting the driving voltage. Different peripherals require different driving voltages. After configuration, IO cell communication direction can only be changed through negotiation and agreement. An IO cell configured to be an output cell is required continually to provide the relevant drive voltage.

It is known to provide ICs with sleep mode capability. In sleep mode, the processor and other large logic circuits can have their Voltage supply removed. Removing the Voltage supply from a circuit avoids the possibility of that circuit leaking current, so the provision of a sleep mode facility can reduce power consumption by the IC. This is particularly significant for 90 nm and smaller processes, with which there is significant leakage current even in standby (i.e. when no oscillating clock signal is being provided to the main circuits).

Even in sleep mode, there typically are a number of external components which do need to be powered. These include memories (particularly SDRAM), sleep oscillators, real time clocks, keyboard detection circuits etcEspecially with the latest semiconductor fabrication processes, it is now fairly common to use IO isolation circuits in the paths from the IO cells to the logic circuits on the IC. It is known to provide an IO isolation circuit between each IO cell and the next component on the IC. This is a precaution against damaging logic by driving it when it does not have any power. Since this allows logic power domains to be switched off, the use of IO isolation circuits provides reduced power consumption. The IO isolation circuits avoid current leakage upstream of the IO isolation circuits (upstream in this case meaning away from the IO cells) when the logic circuits on the IC are off. The IO isolation circuits typically are tie-off or latch cells. Tie-offs have the advantage that they are connected to a constant source, e.g. ground potential, and do not need to be provided with power. The IO cells remain powered when the IC is in sleep mode, so they are always detectable and so that output cells are stable.

When powering down the IC, to enter sleep mode, the processor firstly consents to power-down. Secondly, the IO isolation circuits are controlled by a hardware state machine included in the always active area of the IC to isolate the IO cells from the IC's logic circuits. All the IO isolation circuits are latched simultaneously. The IO isolation circuits may be commonly controlled by a single hardware state machine. Thirdly, the Voltage supply to the logic circuits is switched off. After this third stage, the processor and other logic circuits on the IC are not powered, so are switched off but the always active area and the IO cells remain powered.

When powering up from sleep mode to awake mode, the process is as follows. Firstly, the always-active area activates reset. It then switches on the Voltage supply to the logic circuits on the IC. Once the Voltage is detected to be stable and at a satisfactory level, the controller releases the IO isolation, under hardware control. Since all the IO isolation circuits are commonly controlled by a single hardware component, they are latched simultaneously. Next, the controller releases the reset. Following reset release, the processor boots from memory, typically ROM.

The release of the IO isolation before the releasing of the reset ensures that there is no inadvertent control of the IO cells before they re-enter an active state.

There exist a number of ICs which behave in this way. These ASICs keep IO control values in retention flip-flops (which are located near the IO cells and are always powered) or in the always active area. Particularly, the IO control values are values which determine the signal direction (in or out) that the IO cell relates to, pull up and pull down controls, and voltage values.

A first aspect of the present invention provides an integrated circuit comprising a processor, a controller and plural terminals, each terminal constituting a connection between the integrated circuit and a peripheral device, wherein each terminal is connected to a logic circuit on the integrated circuit by a respective IO cell in series connection with a respective IO isolation circuit and wherein the controller is operable on power up of the integrated circuit to activate a reset state and to release the reset state prior to releasing IO isolation by one or more of the IO isolation circuits.

Each IO isolation circuit may be arranged so that a default state of the IO isolation circuit is a state in which the IO cell is isolated from the logic circuit.

The IO isolation circuits advantageously are controllable by software. In this case, the software may be a driver for a peripheral device connected to the terminal associated with the IO isolation circuit.

Plural IO isolation circuits may be connected so as to be commonly controllable by a single control signal from the controller.

The IO isolation circuits may be powered by an IO cell voltage supply.

The integrated circuit may comprise a respective voltage shifter circuit interposed between each IO cell and the corresponding IO isolation circuit. Alternatively, each IO isolation circuit may be interposed between its corresponding IO cell and a respective voltage shifter circuit.

The IO isolation circuits may be IO isolation latches.

The invention also provides a battery-powered device including an integrated circuit as recited above, and a mobile communications device including such an integrated circuit.

A second aspect of the invention provides a method of operating an integrated circuit comprising a processor, a controller and plural terminals, each terminal constituting a connection between the integrated circuit and a peripheral device, wherein each terminal is connected to a logic circuit on the integrated circuit by a respective IO cell in series connection with a respective IO isolation circuit, the method comprising, on power up of the integrated circuit:
  entering a reset state;
  subsequently releasing the reset state; and
  subsequently releasing IO isolation by the IO isolation circuits.

A third aspect of the invention provides machine readable instructions which when executed by computing apparatus control it to perform a method of operating an integrated circuit comprising a processor, a controller and plural terminals, each terminal constituting a connection between the integrated circuit and a peripheral device, wherein each terminal is connected to a logic circuit on the integrated circuit by a respective IO cell in series connection with a respective IO isolation circuit, the method comprising, on power up of the integrated circuit:
  entering a reset state;
  subsequently releasing the reset state; and
  subsequently releasing IO isolation by the IO isolation circuits.

Embodiments of the present invention will now be described, by way of example only, with reference to the accompanying drawings, in which:

FIGS. 2A and 2B are alternative embodiments of part of the FIG. 1 application specific integrated circuit;

Figure 1:
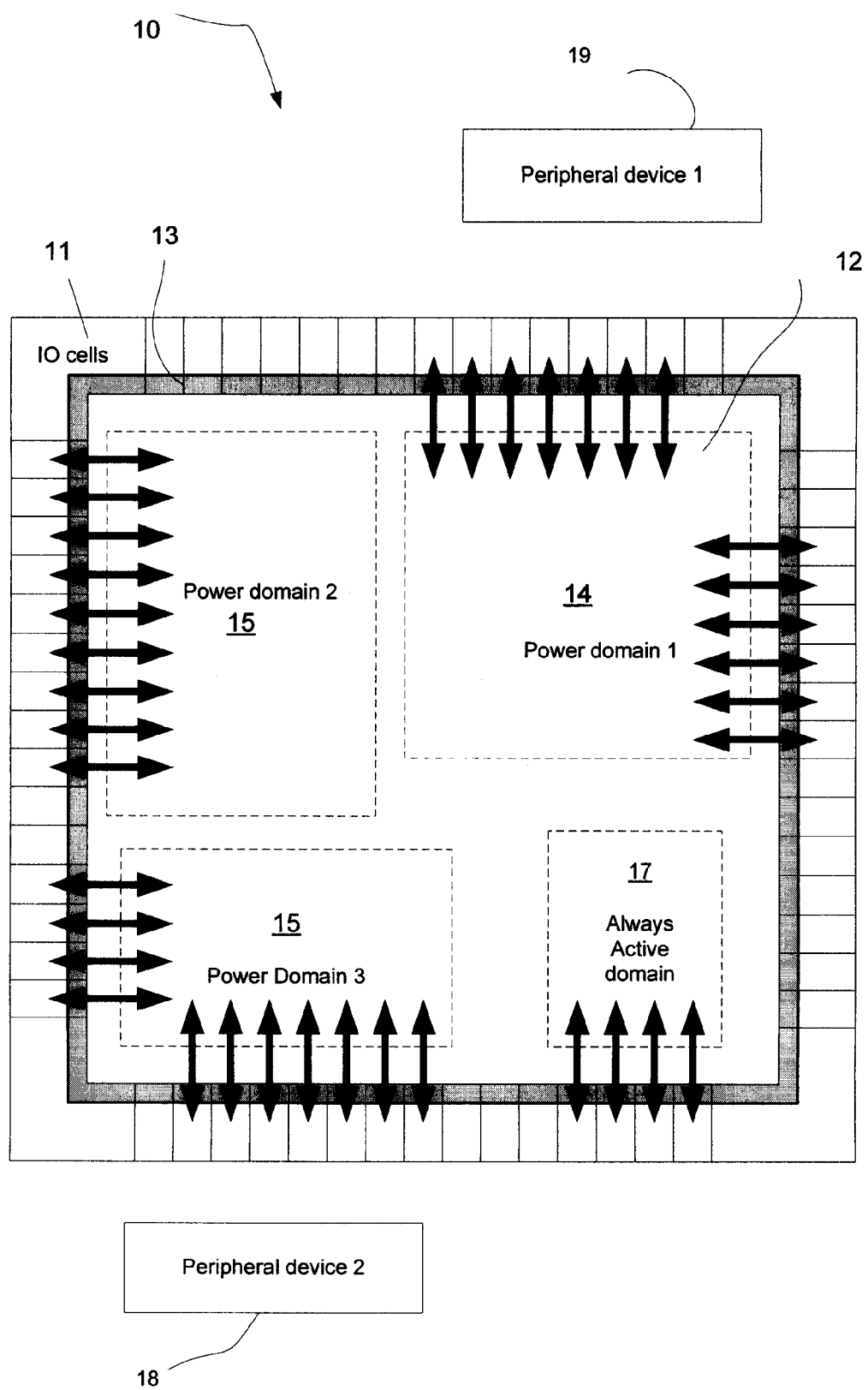
FIG. 1 is a schematic drawing of an application specific integrated circuit embodying the present invention.

Referring to FIG. 1, an application specific integrated circuit (ASIC) 10 is shown including a ring of plural IO (input/output) cells 11 distributed around the periphery of the ASIC 10. Between the IO cells 11 and a main part 12 of the ASIC is a ring of IO cell isolation 13. Within the main part of the ASIC 12 are shown first to third power domains 14, 15 and 16 and an always active domain 17. Each of the first fourth domains 14 to 16 and the always active domain 17 is connected to plural ones of the IO cells 11 via respective connections, indicated as double headed arrows in the Figure. Peripheral devices, two of which are shown at 18 and 19, are connected to the ASIC 10 via some of the ring of IO cells 11. As is explained below, each IO cell is associated with a respective IO cell isolation.

Referring now to FIGS. 2A and 2B, some detail of the FIG. 1 ASIC is shown. Referring firstly to FIG. 2A, a pad 20 of the ASIC is shown connected to a bonding pad 21 via a wire connection 22. The bonding pad 21 is connected directly to an IO cell 23, which is located immediately adjacent the bonding pad 21 on the ASIC 10. The IO cell 23 is one of the ring of IO cells 11 in FIG. 1.

A voltage level shifter 24 is connected to the IO cell 23. The voltage level shifter 24 allows the IO voltage, which is present at the IO cell 23, the bonding pad 21 etc., to be different from the logic voltage, which is the voltage used by the relevant one of the power domains 14 to 16 or the always active domain 17. For instance, the logic voltage may be 1.5V while the IO voltage could be 3.3V.

Connected on the other side of the voltage level shifter 24 to the IO cell 23 is an IO isolation latch 25. On the other side of the isolation latch 25 to the voltage level shifter 24 is control logic 26. The IO isolation latch has a control input 27.

Importantly, the voltage supply for the IO isolation latch can be taken from the IO cell 23, if the cell is powered by a voltage supply (not shown) of the ASIC 10. If the IO cell 23 is not powered by a voltage supply of the ASIC 10, a voltage supply for the IO isolation latch, the IO cell 23 and the voltage level shifter 24 is derived from a IO cell voltage supply (not shown), which continually provides a voltage supply to the IO cells 11 even when the ASIC 10 is in sleep mode. This allows the IO isolation latch 25 to be powered without requiring any of the first to fourth power domains 14 to 16 to be powered.

Referring now to FIG. 2B, reference numerals are retained from FIG. 2A for like elements. The differences between the FIGS. 2A and 2B embodiments are as follows. Instead of the Voltage level shifter 24 being located between the IO isolation latch 25 and the IO cell 23, the IO isolation latch 25 of the FIG. 2B embodiment is located between the IO cell 23 and the voltage level shifter 24, and the voltage level shifter 24 is connected to the device logic 26. This difference means that the IO isolation latch 25 is powered by a voltage supply which is at the IO voltage, rather than at the logic voltage. Otherwise, the FIGS. 2A and 2B embodiments are the same.

In either embodiment, the IO isolation latch 25 provide selective isolation between the device logic 26 and the IO cell 23.

If logic output values are not required to be varied, the IO isolation latch 25 can be replaced by a module with constant output values. The use of a latch gives rise to a more generic design of wider applicability.

Figure 3:
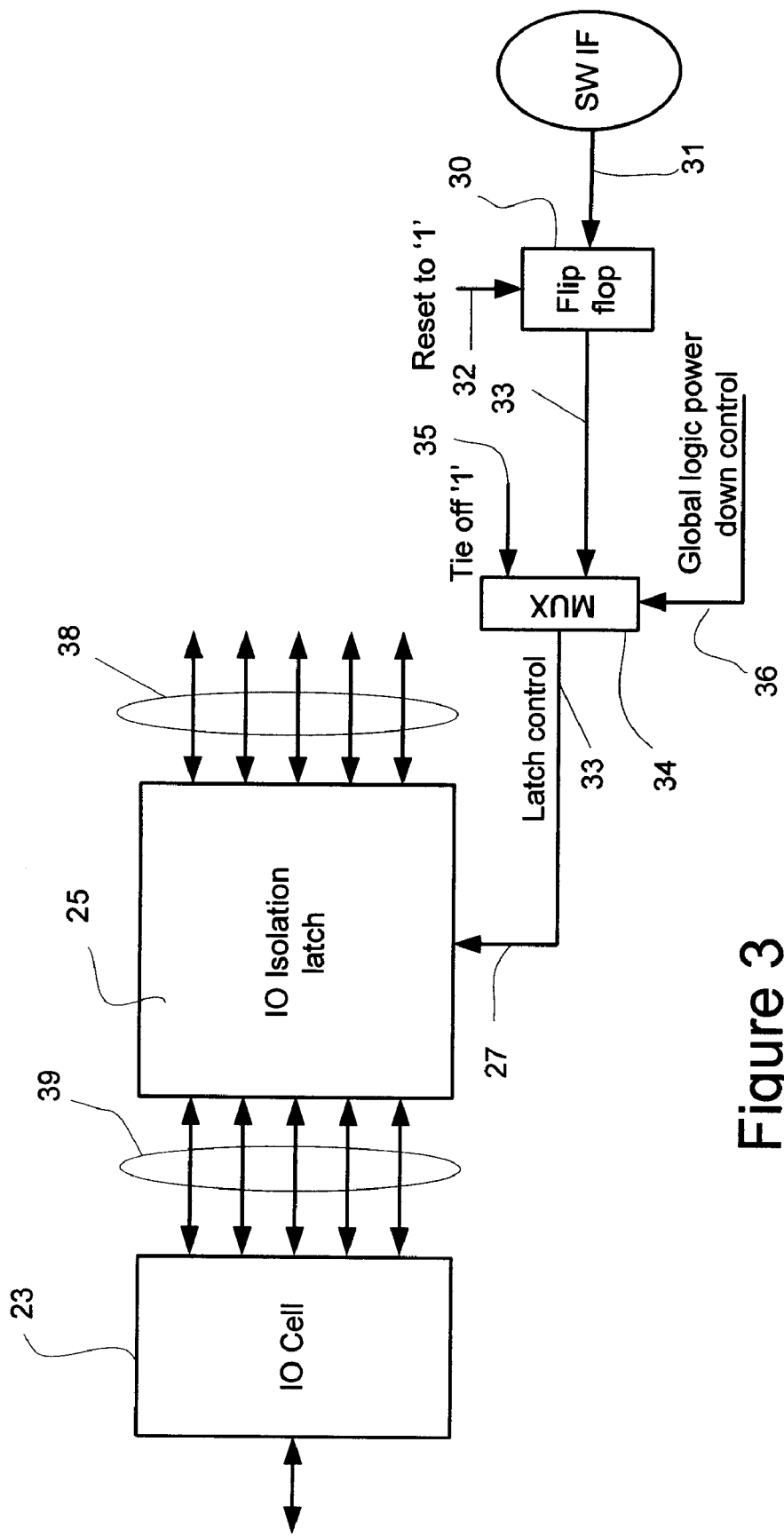
FIG. 3 is a schematic diagram of parts of the FIGS. 1, 2A and 2B circuits.

Referring now to FIG. 3, the circuit of FIGS. 2A and 2B are shown in some more detail. For simplicity, the voltage level shifter 24 is omitted from the figure.

The control input 27 of the IO isolation latch 25 is connected to a circuit comprising a flip-flop 30 including a signal input 31 and a reset input 32. An output 33 of the flip-flop is connected to a first input of a multiplexer 34, a second input 35 of which is connected to a permanent logic "1" signal, termed a tie off 1. A control input of the multiplexer is connected to a global logic power down control input line 36. The output 37 of the multiplexer is connected to the control input 27 of the IO isolation latch 25. Plural lines 38, 39 connect the IO isolation latch 25 to the IO cell 23 and to the device logic 26 respectively.

The multiplexer 34 and the flip-flop 30 are specific to the IO isolation latch 25 in the sense that they are not connected to control any other IO isolation latch. Thus, the IO isolation latch 25, and thus the IO cell 23, can be controlled independently of the others provided on the ASIC 10. This allows pin multiplexing, in which a single pin can be used for different purposes in different product configurations.

The provision of the single IO isolation latch 25 for each IO cell 23 maximises the flexibility of the design. In an alternative embodiment, a group of IO cells 23 are provided with respective IO isolation latches 25 but are commonly controlled by a single multiplexer 34 and flip-flop 30. This reduces component and line counts on the ASIC 10.

The IO isolation latch 25 is arranged so that it provides isolation between the IO cell 23 and the device logic 26 when the signal provided at the control input 27 is a logic "1", and does not provide isolation if the signal at the control input 27 is a logic "0". When isolation is provided by the IO isolation latch, the outputs of the IO isolation latch are frozen, and input signals have no effect on the latch outputs. When isolation is released, signals input from the device logic 26 are passed to the IO cell 23.

The multiplexer 34 is arranged such that it provides the logic 1 signal from the input 35 to the output 37 when a logic 1 signal is received on the global logic power down control line 36, and provides the logic signal from the input 33 otherwise. Thus, a logic 1 signal is provided to the control input 27 of the IO isolation latch when a logic 1 signal is provided to the global logic power down control line 36. Thus, isolation is provided between the IO cell 23 and the device logic 26 when a global logic power down control signal is provided. Such a signal is provided before logic power is turned off, thereby ensuring that isolation between the device logic 26 an the IO cell 23 is present when the logic voltage is switched off. The global logic power down control signal is lifted, i.e. changed to logic 0, when the logic voltage is stabilised after powering up from sleep mode.

Furthermore, following a reset, during which a logic 1 signal is provided to the reset input 32 of the flip-flop 30, the IO isolation latch 25 is enabled even when a logic 0 signal is applied to the global logic power down control line 36, since in this instance a logic 1 signal is provided on the input 33 to the multiplexer 34. Connection between the IO cell 23 and the device logic 26 is allowed by the IO isolation latch 25 only when a software-initiated control signal is received at the input 31 to the flip-flop 30 at a time when the output of the flip-flop 30 was a logic 1. In this case, the output of the flip-flop 30 is changed to a logic 0, and this is received at the input 33 of the multiplexer 34. In this case, the logic 0 signal is provided to the output 37 of the multiplexer, and thus the control input 27 of the IO isolation latch 25, on the condition that the global logic power down control line 36 is at that time provided with a logic 0. When a logic 0 signal is received at the control input 27 of the IO isolation latch 25, isolation between the IO cell 23 and the device logic 26 is removed.

It will be appreciated that the IO cell 23 can be isolated from the device logic 26 by the IO isolation latch 25 by any one of three different actions. Firstly, if there is a global logic power down control signal provided on the control line 36, the multiplexer 34 is switched so that a logic 1 signal is provided on its output 37. Secondly, if a reset signal is provided, the flip-flop 30 is reset to provide a logic 1 to the second input 33 of the multiplexer 34. Alternatively, IO isolation can be provided by the provision of a logic 1 signal on the input 31 to the flip-flop 30. Thus, when suitable signals are provided at the global logic power down control line 36 and the reset line 32, the IO isolation latch 25 can be switched on and off by software.

It is important to note that a default state for the IO isolation latch 25 is off, i.e. providing isolation between the IO cell 23 and the device logic 26. The isolation can be removed only when correct logic signals are provided at the global logic power down control line 36 and the reset line 32 and when the software issues a control signal specifically requesting that isolation be released.

Figure 4:
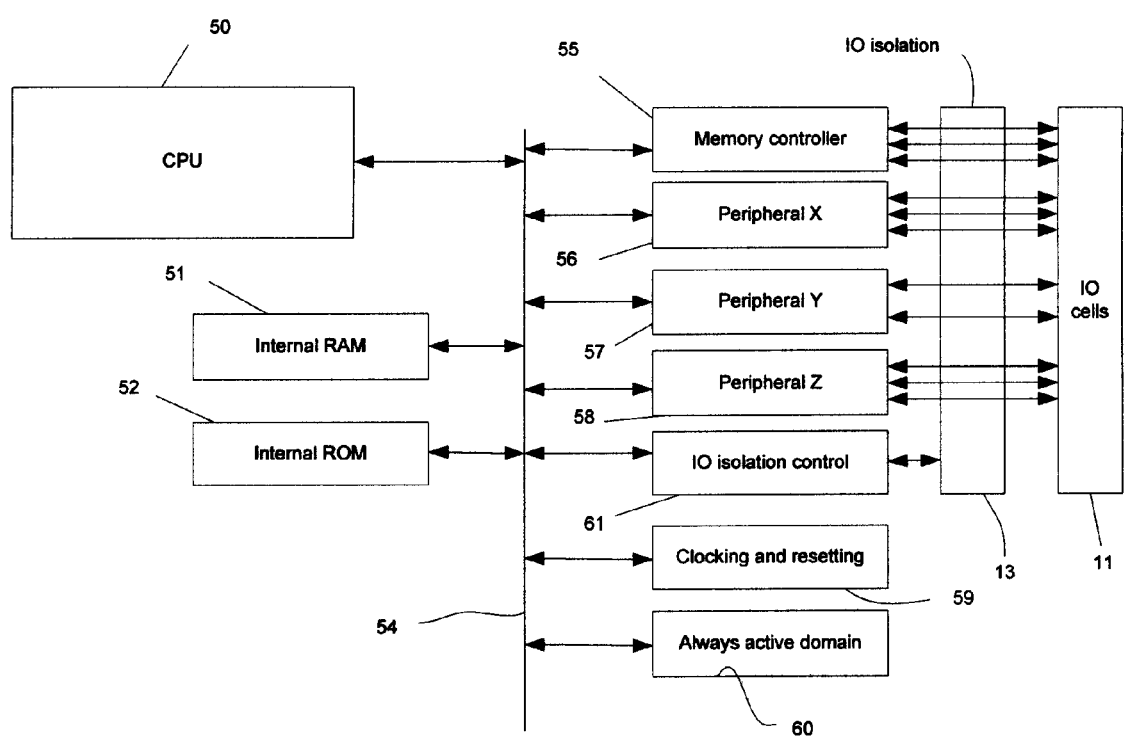
FIG. 4 is a schematic diagram illustrating the connection of components forming part of the FIG. 1 application specific integrated circuit.

Referring now to FIG. 4, components of the ASIC 10 include a CPU 50, an internal RAM 51, an internal ROM 52 and a number of other devices all connected to an internal bus 54. The other devices connected to the internal bus 54 include a memory controller 55, a first peripheral module 56, a second peripheral module 57, a third peripheral module 58, a clocking and resetting module 59, an always active domain 60 and an IO isolation control module 61. The IO cells 11 are connected to the memory controller 55 and the first to third peripherals 56 to 58 via the IO isolation 13.

The IO isolation control module 59 provides the global logic power down control signal to the global logic power down control line 36 of all of the IO isolation circuits on the ASIC 10. Thus, the IO isolation control module 59 is operable to provide isolation between all of the IO cells 11 and the ASIC when required.

The software-initiated control signal provided to the input 31 of the flip flop 30 is provided by the one of the memory controller 55, the first peripheral 56, the second peripheral 57, the third peripheral 58 and the clocking and resetting module 59 to which the relevant IO isolation circuit is connected. The fact that the control signal is provided by a hardware module which is located close on the ASIC 10 to the relevant IO isolation latches is advantageous since it reduces signal transition times and reduces the possibility of errors.

This arrangement allows a new wake-up sequence from sleep mode, as follows.

Firstly, reset is activated. At this stage, a logic 1 signal is provided to the reset input 32 of all of the flip flops 30. This causes the flip flops 30 to revert to a state in which they provide a logic 1 signal at their output 33. The result of this is that isolation is maintained after the global logic power down control signal is lifted even if isolation was not present when the IO isolation control module was controlled to provide a logic 0 signal to the global logic power down control signal lines 36, as will be apparent from the description below. However, this does not result in a change on state in any of the IO isolation latches 25 since all at this stage are controlled to provide isolation.

Secondly, voltage supply is provided to the logic in the relevant ones of the first to third power domains 14 to 16.

After waiting for a period of time sufficient for the voltage level in the power domains 14 to 16 to stabilise, the reset is released.

Following release of the reset, the processor 50 boots from the ROM 52. Booting-up in this sense involves running a CPU device driver software program which is stored in the ROM 51. In the following, actions are attached to the CPU device driver software, although it will be appreciated that actions actually are taken by hardware under control, of the CPU device driver software.

The CPU device driver then sets up pin multiplexing, if required. To achieve this, the CPU device driver is pre-provided with the output values associated with the IO cell 23 and uses these values to set-up the IO cell 23. In alternative embodiments, the CPU device driver can read the relevant signals present at the IO cell 23 which, because the IO cell 23 remains powered when the ASIC 10 is in sleep mode, indicate the values that apply to the IO cell 23. In this case, the values that are required to apply to the IO cell could be the values pre-existing prior to waking from sleep mode, or they could be some function of those values.

At this stage, the ASIC 10 is awake but isolated from the IO cells 23. This is advantageous sine it reduces the possibility of floating signals corrupting the IO cells 23 or peripheral components.

Following the pin multiplexing set up step, the CPU device driver configures the external hardware module connected to the pins, if needed. For instance, the peripheral device may be configured so that its state reflects the pin multiplexing which is to be used for that peripheral device.

Following this, the CPU device driver releases IO isolation for any IO cells 11 which are needed to complete booting. If booting can be completed solely from the ASIC 10, then this step can be omitted. Sometimes, though, this step cannot be omitted. For instance, in some embodiments the CPU needs to access external memory or other devices in order to initialise, in which case the CPU device driver releases the isolation on the relevant ones of the IO cells 11 during initialisation so that the external device can be accessed. The timing of the release of IO isolation is determined by the CPU driver software, which controls the initialisation of the CPU. Alternatively, in other embodiments, the control of IO isolation latches 25 during initialisation of the CPU is controlled by a hardware state machine.

Once the CPU has finished booting up, the ASIC 10 is powered and the relevant ones (if any) of the IO isolation logic latches 25 are controlled to release isolation of their IO cells 23 to the relevant device logic. Once powered up, the ASIC 10 can begin to perform functions required of it.

When a function of the ASIC 10 requires involvement of a peripheral device, a software device driver for that peripheral device is loaded, either from the ROM 52 or from an external ROM (not shown). The peripheral device driver software includes instructions which release isolation to the IO cells 23 which are connected to the relevant peripheral device. The software device driver controls the relevant hardware of the ASIC 10 to provide a logic 1 signal to the input 31 of the flip flop 30 of the relevant IO isolation circuits, and thereby releases the relevant IO isolation. This can require only one write operation, and thus presents a very small processing overhead. What is the relevant hardware depends on the peripheral device, but might be for instance the memory controller 55, the first peripheral module 56, the second peripheral module 57 or the third peripheral module 58. Although the release of the isolation is effected by hardware, in particular the memory controller 55, the module 56 to 58 and the relevant IO isolation circuit, the release of isolation is effected under software control.

Thus, unless an IO isolation latch 25 is specifically released by a software module, for instance the CPU device driver or a peripheral device driver, the IO isolation latch 25 stays in a state in which is isolates its IO cell 23 from the relevant device logic 26. This is particularly advantageous because it allows IO cells 23 which are not required to be used at a given time to be isolated from the device logic on the ASIC 10. This has advantages in terms of power consumption since leakage current is reduced. Perhaps more significantly, this provides fewer opportunities for errors occurring.

Using a corresponding mechanism, the device driver software can reinstate isolation between the relevant IO cells 23 and the device logic by controlling the relevant hardware of the ASIC 10 to provide a logic 0 signal to the input 31 of the flip flop 30 of the relevant IO isolation circuits. In this way, one of the power domains 15 to 17 can be powered down without placing the whole of the ASIC 10 into sleep mode. Again, this has advantages in terms of power consumption since leakage current is reduced, and it provides fewer opportunities for errors occurring.

In all embodiments, the arrangement allows a simple sequence with which to power down the ASIC 10 to sleep mode. Firstly, the CPU 50 consents to power down mode. Secondly, the IO isolation control module is controlled to provide a logic 0 signal to the global logic power down control signal lines 36. This causes all of the IO isolation latches 25 to provide isolation, whether or not they were already providing isolation. Following this step, the logic voltage is turned off on the ASIC 10. The result is that only the IO cells 23, the IO isolation latches and the always active area 17 (and maybe the Voltage level shifter 24) are powered, whilst isolation between the IO cells 23 and the device logic 26 on the ASIC 10 is present.

There are numerous advantages of the above-described arrangements.

The fact that the ASIC 10 is in sleep mode is hidden from the peripheral devices connected to it. This is the case since the IO cells 23 remain powered, and providing the relevant drive signals if they are output IO cells.

Isolation is wholly within software control, so the hardware can be simpler than corresponding conventional arrangements.

IO cells 23 are isolated individually, or in relatively small groups. Thus, some IO cells 23 can be isolated from device logic whilst others are not isolated.

Since only certain IO cells 23 have isolation removed, the time to boot up the ASIC 10 from sleep mode can be less than corresponding conventional arrangements.

The software required to implement the IO isolation can be relatively simple. Importantly, it does not need to be centralised, and instead can be handled by the relevant device driver software.

The embodiments allow IO set up and pin multiplexing steps to be completed before isolation is released, which results in a simpler arrangement than corresponding conventional arrangements. The embodiments allow pin multiplexing to be freely changed whilst IO isolation is active, in contrast to conventional arrangements.

The implementation of the ASIC 10 can be simpler since it can be possible to avoid the use of always-on flip flops or buffers.

Isolation signal routing is easier since the hardware which issues the control signals can be located close on the ASIC 10 to the relevant IO cells 23. This provides for good signal integrity and simpler timing.

IO cells are isolated by default. This provides power saving advantages, and reduces the possibility of errors, for instance glitches and incorrect signal state changes, occurring. It contrasts to conventional arrangements, in which isolation is removed for all IO cells prior to releasing reset.

A disadvantage is present in that isolation is controlled by software, so IO cells 23 are not always useable without prior configuration.

It will be appreciated that various modifications to the above-described embodiments may be made without departing from the invention, the scope of which is defined by the appended claims and their equivalents.

Moreover, the disclosure of the present application should be understood to include any novel features or any novel combination of features either explicitly or implicitly disclosed herein or any generalisation thereof and during the prosecution of the present application or of any application derived therefrom, new claims may be formulated to cover any such features and/or combination of such features.

The invention claimed is:

1. An apparatus comprising a processor, a controller and plural terminals, each terminal comprising a connection between the apparatus and a peripheral device,
    wherein each terminal interfaces to a logic circuit on the apparatus by a respective input/output IO cell in series connection with a respective IO isolation circuit and wherein the controller is operable on power up of the apparatus to activate a reset state and to release the reset state prior to releasing IO isolation by one or more of the IO isolation circuits.

2. An apparatus as claimed in claim 1, wherein each IO isolation circuit is arranged so that a default state of the IO isolation circuit is a state in which the IO cell is isolated from the logic circuit.

3. An apparatus as claimed in claim 1, wherein the IO isolation circuits are controllable by software.

4. An apparatus as claimed in claim 3, wherein the software is a driver for a peripheral device connected to the terminal associated with the IO isolation circuit.

5. An apparatus as claimed in claim 1, wherein plural IO isolation circuits are connected so as to be commonly controllable by a single control signal from the controller.

6. An apparatus as claimed in claim 1, wherein the IO isolation circuits are powered by an IO cell voltage supply.

7. An apparatus as claimed in claim 1, comprising a respective voltage shifter circuit interposed between each IO cell and the corresponding IO isolation circuit.

8. An apparatus as claimed in claim 1, wherein each IO isolation circuit is interposed between its corresponding IO cell and a respective voltage shifter circuit.

9. An apparatus as claimed in claim 1, wherein the IO isolation circuits are IO isolation latches.

10. A battery-powered device including an apparatus according to claim 1.

11. A mobile communications device including an apparatus according to claim 1, in which the apparatus comprises an integrated circuit.

12. A method of operating an integrated circuit comprising a processor, a controller and plural terminals, each terminal comprising a connection between the integrated circuit and a peripheral device, wherein each terminal interfaces to a logic circuit on the integrated circuit by a respective input/output IO cell in series connection with a respective IO isolation circuit, the method comprising, on power up of the integrated circuit:
   entering a reset state;
   subsequently releasing the reset state; and
   subsequently releasing IO isolation by the IO isolation circuits.

13. A memory storing machine readable instructions, which when executed by computing apparatus control it to perform a method of operating an integrated circuit comprising a processor, a controller and plural terminals, each terminal comprising a connection between the integrated circuit and a peripheral device, wherein each terminal interfaces to a logic circuit on the integrated circuit by a respective input/output IO cell in series connection with a respective IO isolation circuit,
   the method comprising, on power up of the integrated circuit:
   entering a reset state;
   subsequently releasing the reset state; and
   subsequently releasing IO isolation by the IO isolation circuits.

14. A method as claimed in claim 12, wherein each IO isolation circuit is arranged so that a default state of the IO isolation circuit is a state in which the IO cell is isolated from the logic circuit.

15. A method as claimed in claim 12, wherein the IO isolation circuits are controllable by a software driver for a peripheral device connected to the terminal and associated with the IO isolation circuit.

16. A method as claimed in claim 12, wherein plural IO isolation circuits are connected so as to be commonly controllable by a single control signal from the controller.

17. A method as claimed in claim 12, wherein the IO isolation circuits are powered by an IO cell voltage supply.

18. A method as claimed in claim 12, wherein the integrated circuit comprises a respective voltage shifter circuit interposed between each IO cell and the corresponding IO isolation circuit.

19. A method as claimed in claim 12, wherein each IO isolation circuit is interposed between its corresponding IO cell and a respective voltage shifter circuit.

20. A method as claimed in claim 12, wherein the IO isolation circuits are IO isolation latches.

* * * * *